(12) United States Patent
Goyal et al.

(10) Patent No.: US 8,518,526 B2
(45) Date of Patent: Aug. 27, 2013

(54) STRUCTURES WITH THREE DIMENSIONAL NANOFENCES COMPRISING SINGLE CRYSTAL SEGMENTS

(75) Inventors: Amit Goyal, Knoxville, TN (US); Sung-Hun Wee, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 701 days.

(21) Appl. No.: 12/711,309

(22) Filed: Feb. 24, 2010

(65) Prior Publication Data

US 2011/0033674 A1 Feb. 10, 2011

Related U.S. Application Data

(60) Provisional application No. 61/231,063, filed on Aug. 4, 2009.

(51) Int. Cl.
*D02G 3/00* (2006.01)
(52) U.S. Cl.
USPC ............ 428/221; 428/364; 428/401; 977/762
(58) Field of Classification Search
USPC ................. 977/762, 763, 773; 428/221, 364, 428/401
See application file for complete search history.

(56) References Cited

U.S. PATENT DOCUMENTS

| | | | | |
|---|---|---|---|---|
| 6,106,615 | A * | 8/2000 | Goyal et al. | 117/84 |
| 2006/0057360 | A1* | 3/2006 | Samuelson et al. | 428/323 |
| 2008/0003839 | A1* | 1/2008 | Park et al. | 438/800 |

OTHER PUBLICATIONS

Wee et al., "A three-dimensional, biaxially textured oxide nanofence composed of MgO single crystal nanobelt segments," Nanotechnology 20 (2009).*

Lu, Wei and Lieber, Charles M., "Seimiconductor Nanowires," J. Phys. D: Appl. Phys., 2006, pp. R387-R406, vol. 39.

Wang, N, et al., "Growth of Nanowires," Mater. Sci. & Eng.. 2008, pp. 1-51, R 60.

Morales, A.M. and Lieber, C. M., Science, 1998, pp. 208-211, vol. 279.

Xiangfeng Duan, et al., Indium Phosphide Nanowires as Building Blocks for Nanoscale Electronic and Optoelectronic Devices, Nature, 2001, pp. 66-69, vol. 409.

Zheng Wei Pan, et al., "Nanobelts of Semiconducting Oxides," Science, 2001, pp. 1947-1949, vol. 291.

Kar, Soumitra and Chaudhuri, Subhadra, "Synthesis and Characterization of One-Dimensional MgO Nanostructures," J. Nanosci. Nanotech, 2006, pp. 1447-1452, vol. 6.

Ahn, Jong-Hyun, et al., "Heterogeneous Three-Dimensional Electronics by Use of Printed Semiconductor Nanomaterials," Science, 2006, pp. 1754-1757, vol. 314.

(Continued)

*Primary Examiner* — Matthew Matzek
(74) *Attorney, Agent, or Firm* — Joseph A. Marasco

(57) ABSTRACT

An article includes a substrate having a surface and a nanofence supported by the surface. The nanofence includes a multiplicity of primary nanorods and branch nanorods, each of the primary nanorods being attached to said substrate, and each of the branch nanorods being attached to a primary nanorods and/or another branch nanorod. The primary and branch nanorods are arranged in a three-dimensional, interconnected, interpenetrating, grid-like network defining interstices within the nanofence. The article further includes an enveloping layer supported by the nanofence, disposed in the interstices, and forming a coating on the primary and branch nanorods. The enveloping layer has a different composition from that of the nanofence and includes a radial p-n single junction solar cell photovoltaic material and/or a radial p-n multiple junction solar cell photovoltaic material.

17 Claims, 20 Drawing Sheets

(56) References Cited

OTHER PUBLICATIONS

Javey, Ali, et al., "Layer-by-Layer Assembly of Nanowires for Three-Dimensional, Multifunctional Electronics," Nano Letters, 2007, pp. 773-777, vol. 7, No. 3.

Liang, Yongqi, et al., "Preparation of Free-Standing Nanowire Arrays on Conductive Substrates," J. Am. Chem. Soc.. 2004, pp. 16338-16339, vol. 126.

Nagashima, Kazuki, et al., "Epitaxial Growth of MgO Nanowires by Pulsed Laser Deposition," J. Appl. Phys., 2007, pp. 124304-1 to 124304-4, vol. 101.

Huang, Michael H., et al., "Room-Temperature Ultraviolet Nanowire Nanolasers," Science, 2001, pp. 1897-1899, vol. 292.

Han, Song, et al., Transition Metla Oxide Core-Shell Nanowires: Generic Synthesis and Transport Studies, Nano Letters, 2004, pp. 1241-1246, vol. 4, No. 7.

Long, Hu, et al., "MgO Nanowire Growth from Mg Metal and SiO2," J. Nanosci. Nanotech., 2004, pp. 1071-1075, vol. 4, No. 8.

Saylor, David M., et al., "Experimental Method for Determining Surface Energy Anisotropy and Its Application to Magnesia," J. Am. Ceram. Soc., 2000, pp. 1226-1232, vol. 83, No. 5.

\* cited by examiner

STRUCTURES WITH THREE DIMENSIONAL NANOFENCES COMPRISING SINGLE CRYSTAL SEGMENTS

CROSS REFERENCE TO RELATED APPLICATION

This application claims priority to U.S. Provisional Patent Application No. 61/231,063 which was filed on Aug. 4, 2009.

STATEMENT REGARDING FEDERALLY SPONSORED RESEARCH

The United States Government has rights in this invention pursuant to contract no. DE-AC05-00OR22725 between the United States Department of Energy and UT-Battelle, LLC.

BACKGROUND OF THE INVENTION

While fabrication of a variety of interesting nanostructures has been demonstrated in small samples, a predominant number of the methods for making such nanostructures are not readily scalable or completely reproducible. In many cases, for example, deposits in a furnace downstream trap have to be scraped and nanostructures harvested therefrom. Therefore, such nanostructures are prohibitively expensive and the utility thereof cannot be realized. Reproducible and controlled fabrication of nanostructures is needed for many novel electronic and electromagnetic devices such as those involving semiconductors and superconductors.

BRIEF DESCRIPTION OF THE DRAWINGS

FIG. 1 is a top-view, high magnification FE-SEM image showing morphology for three dimensional (3D), biaxially-textured, MgO nanofence epitaxially grown on (100) SrTiO3 substrate in accordance with examples of the present invention. The higher magnification SEM image shows the 3D nanofence structure clearly.

Figure 1:
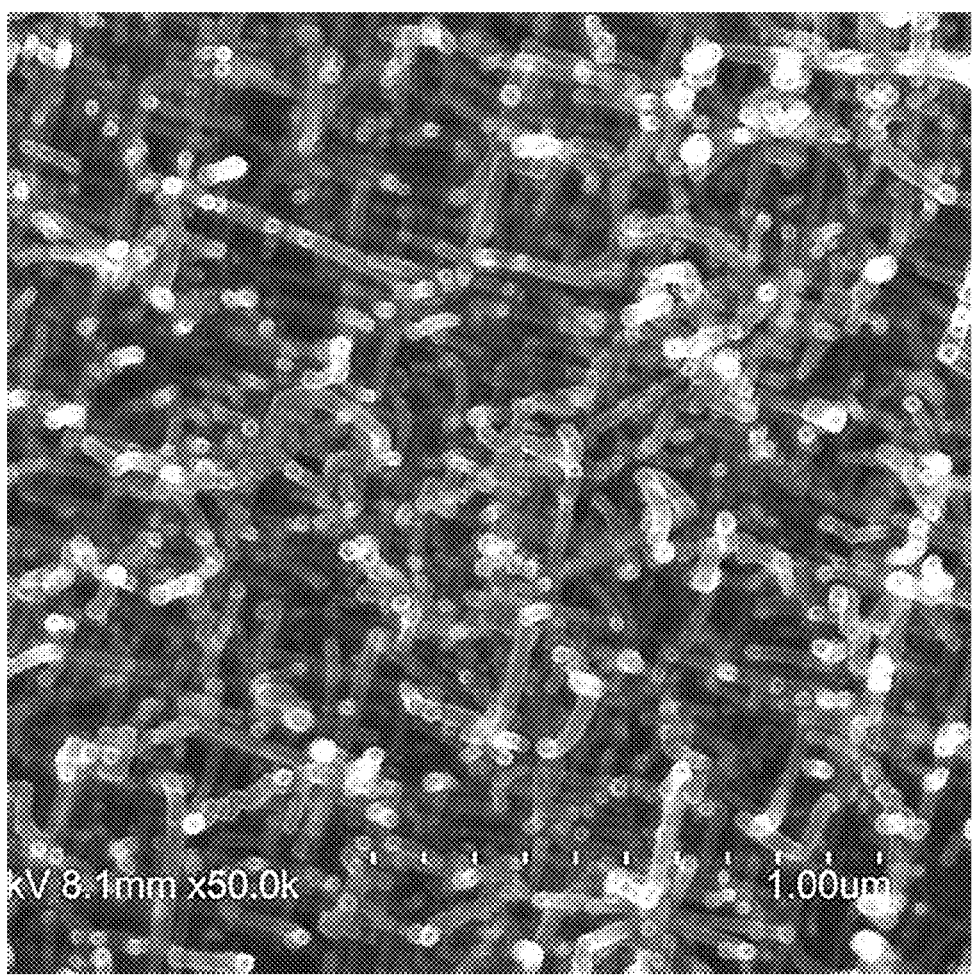
FIG. 1 is a top-view, low magnification FE-SEM image showing morphology for three dimensional (3D), biaxially-textured, MgO nanofence epitaxially grown on (100) SrTiO3 substrate in accordance with examples of the present invention.

For a better understanding of the present invention, together with other and further objects, advantages and capabilities thereof, reference is made to the following disclosure and appended claims in connection with the above-described drawings.

DETAILED DESCRIPTION OF THE INVENTION

In accordance with examples of the present invention, an article includes a substrate having a surface, and a nanofence supported by the surface. The nanofence includes a multiplicity of primary nanorods and branch nanorods, each of which is a single crystal nanostructure. The primary nanorods are attached to the substrate and the branch nanorods are attached to at least one other of the primary nanorods and the branch nanorods. The primary nanorods and the branch nanorods are arranged in a three-dimensional, interconnected, interpenetrating, grid-like network defining interstices within the nanofence.

In accordance with examples of the present invention, a method of fabricating an article includes the steps of: providing a substrate having a surface; heating the substrate to a predetermined temperature; and co-depositing a material and a catalyst via a carrier gas onto the biaxially textured surface to grow a nanofence thereon.

In accordance with examples of the present invention, a method of fabricating a superconducting article includes the steps of: providing a substrate having a biaxially textured surface; heating the substrate to a predetermined temperature; forming an intermediate article by co-depositing a material and a catalyst via a carrier gas onto the biaxially textured surface to grow a metal oxide nanofence thereon; cooling the intermediate article to room temperature; heating the intermediate article to a predetermined temperature; and epitaxially depositing on the nanofence a superconducting matrix layer that is disposed within interstices of the nanofence so that the nanofence is at least partially embedded within the superconducting matrix layer.

In accordance with examples of the present invention, a method of fabricating a superconducting article includes the steps of: providing a substrate having a biaxially textured surface; heating the substrate to a predetermined temperature; forming a first intermediate article by co-depositing a material and a catalyst via a carrier gas onto the biaxially textured surface to grow a metal oxide nanofence thereon; cooling the first intermediate article to room temperature; forming a second intermediate article by depositing on the nanofence a superconductor precursor matrix layer that is disposed within interstices of the nanofence so that the nanofence is at least partially embedded within the superconductor precursor matrix layer; heating the second intermediate article in a furnace to a predetermined temperature and for a predetermined time period to convert the superconductor precursor layer to a biaxially textured superconductor layer.

In accordance with examples of the present invention unique, fabrication of epitaxial, self-assembled, three-dimensional (3D) "nanofences" can be achieved via a simple and novel approach which can easily be scaled-up and potentially be used to fabricate similar structures of various compositions. The present invention involves co-deposition of a source material and a catalyst that assists nanostructure growth via vapor-liquid-solid (VLS) related mechanism.

In accordance with examples of the present invention, a substrate having a surface is provided. Examples of suitable substrates are, for example: a single crystal substrate; a biaxially textured substrate, for example, a rolling-assisted biaxially textured substrate (RABiTS); an untextured body having adhered thereon a biaxially-textured crystallographic surface layer, for example, an ion-beam assisted deposition (IBAD) substrate; and a polycrystalline or amorphous substrate.

In accordance with the present invention, a deposited layer of nanostructures arranged in a network called a "nanofence" is supported by the substrate. The type of nanostructures applicable to the present invention are also called nanorods, nanobelts, nanowires, nanowhiskers, nanofibers and/or other such nomenclature that is known and established in the art. The skilled artisan will recognize that such nomenclature is generally nominal and sometimes interchangeable. The term "nanorod" as used herein is defined as a nanostructure having a rod-like, wire-like, or fiber-like shape. A nanorod can be comprised of a single crystal nanostructure. A "nanobelt" as used herein is defined as a nanorod having an angular cross-section, particularly a rectangular cross-section. The term "primary nanorod" as used herein is defined as a nanorod grown directly on and attached to the substrate. The term "branch nanorod" as used herein is defined as a nanorod grown from and attached to the side of another nanorod. Branch nanorods include secondary nanorods, which are grown from and attached to primary nanorods, tertiary nanorods, which are grown from and attached to secondary nanorods, and so forth. The term "nanofence" as used herein is defined as a three-dimensional, interconnected, interpenetrating, grid-like network of primary nanorods and branch nanorods.

The deposited layer can be, for example, biaxially textured (epitaxially aligned with respect to the crystallographic substrate surface within 10° in at least two axes). Such alignment can be, for example, within 9°, 8°, 7°, 6°, 5°, 4°, 3°, 2°, or 1°. The skilled artisan will recognize that the difficulty of manufacture increases as the angle of alignment decreases.

Nanofences can be formed from oxides, nitrides, borides and carbides, or any combination of the foregoing. The nanofence can have various crystal structures including rock-salt, fluorite, perovskite and pyrochlore. One example of fabrication of 3D epitaxial, oxide nanofence is that of magnesium oxide (MgO), a typical binary oxide with a rock-salt crystal structure that is widely used as a template to fabricate epitaxial multifunctional films due to its structural similarity and low lattice mismatch with these materials.

Examples of functional devices that are feasible with the present invention include, but are not limited to semiconducting devices, ferroelectric devices, ferromagnetic devices, magnetic devices, photovoltaic devices, batteries, capacitors, and superconducting devices.

Another example of a 3D epitaxial, oxide nanofence includes fabrication of a $SnO_2$ nanofence using either Sn or $SnO_2$ containing source and gold, silver, Ni or another metallic catalyst. Another example is fabrication of a $TiO_2$ nanofence using either a Ti or a $TiO_2$ containing source and a suitable metal catalyst. Several other simple oxides of interest include ZnO, $ZrO_2$, $Ta_2O_3$ and $Nb_2O_3$. Nanofences which contain more than one cation can also be fabricated such as a doped MgO, $TiO_2$ or $SnO_2$ nanofence. In this case, the dopant is also included in the source material. Some examples of additional cations include Ba or Sr to form $BaZrO_3$, $BaTiO_3$, $BaNbO_3$, $SrTiO_3$ and $BaSnO_3$.

A three-dimensional (3D), biaxially-textured, MgO, nanofence comprised of single crystal MgO nanobelt segments or links is synthesized via epitaxial growth on (100) $SrTiO_3$ substrates. Individual single crystal MgO nanobelt segments comprising the nanofence have a square cross-section with dimensions in the range of 10-20 nm and with lengths in the range from 100 nm up to 1 μm. X-ray diffraction shows that the 3D MgO nanofence has an epitaxial relation with (100) $SrTiO_3$ substrates with a cube-on-cube, {100}<100> orientation and with a full-width-half-maximum values of (200) ω-scan and (110) φ-scan with 4.5° and 5.5°, respectively. Such a biaxially-textured oxide nanofence with single crystal segments can be used as 3D nanotemplated substrate for epitaxial growth of wide-ranging, 3D, electronic, magnetic and electromagnetic nanodevices.

3D self-assembled MgO nanobelts were epitaxially grown on (100) $SrTiO_3$ (STO) substrate via co-laser ablation of MgO and Ni catalyst using KrF excimer laser (λ=248 nm) at a repetition rate of 10 Hz. To accomplish co-deposition, a 3 mm wide Ni metal foil was attached to the surface of MgO target. When the target was rotated, one shot of Ni was periodically ablated per 10-11 shots for MgO. Laser energy density and substrate to target distance was set to 4 J/cm² and 7 cm, respectively. A substrate temperature ($T_s$) of 780° C. and a deposition pressure of 200 mTorr, 4% $H_2$/Ar gas was used. After deposition, samples were cooled down to room temperature at a cooling rate of 20° C/min. Phase and texture analysis was performed using a Picker 4-circle diffractometer with CuKα radiation for θ-2θ, ω and φ-scans, respectively. Microstructures for samples were characterized via field emission scanning electron microscopy (Hitachi S4800 FESEM) and transmission electron microscopy (Hitachi HF-3300 TEM).

Continuous supply of the catalyst, Ni metal, during growth was key to the synthesis of 3D, biaxially-textured MgO nanofence with a unique, self-organized structure along <100> directions of (100) STO substrate. FIGS. 1-5 show plan-view FE-SEM and cross-section TEM images for the MgO nanofence grown epitaxially on the (100) STO substrate. This particular sample was grown using a standard MgO target with a Ni strip attached to it and covering ~9% area of the target. Since the laser plume for ablation from Ni was almost half size that for MgO, the actual quantity of Ni in the sample is expected to be much less than 9%.

Figure 2:
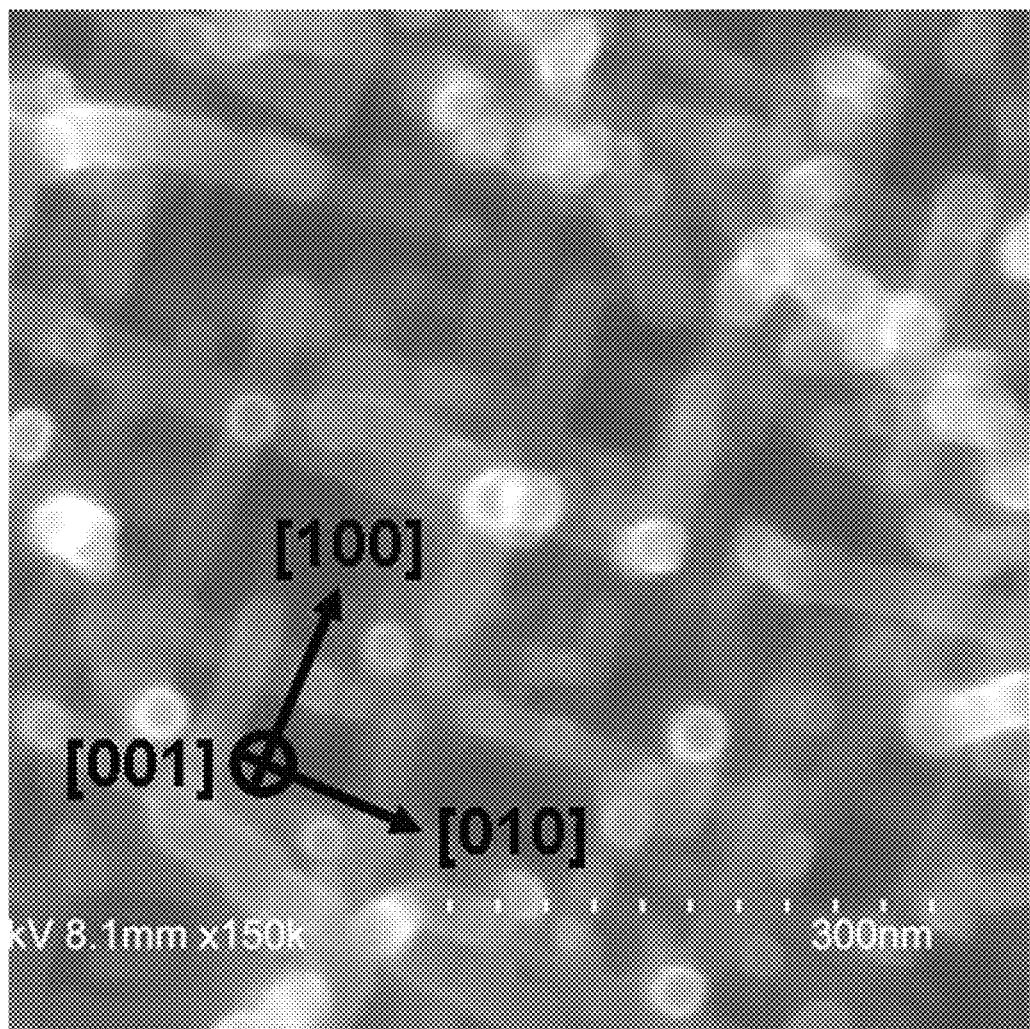
Figure 3:
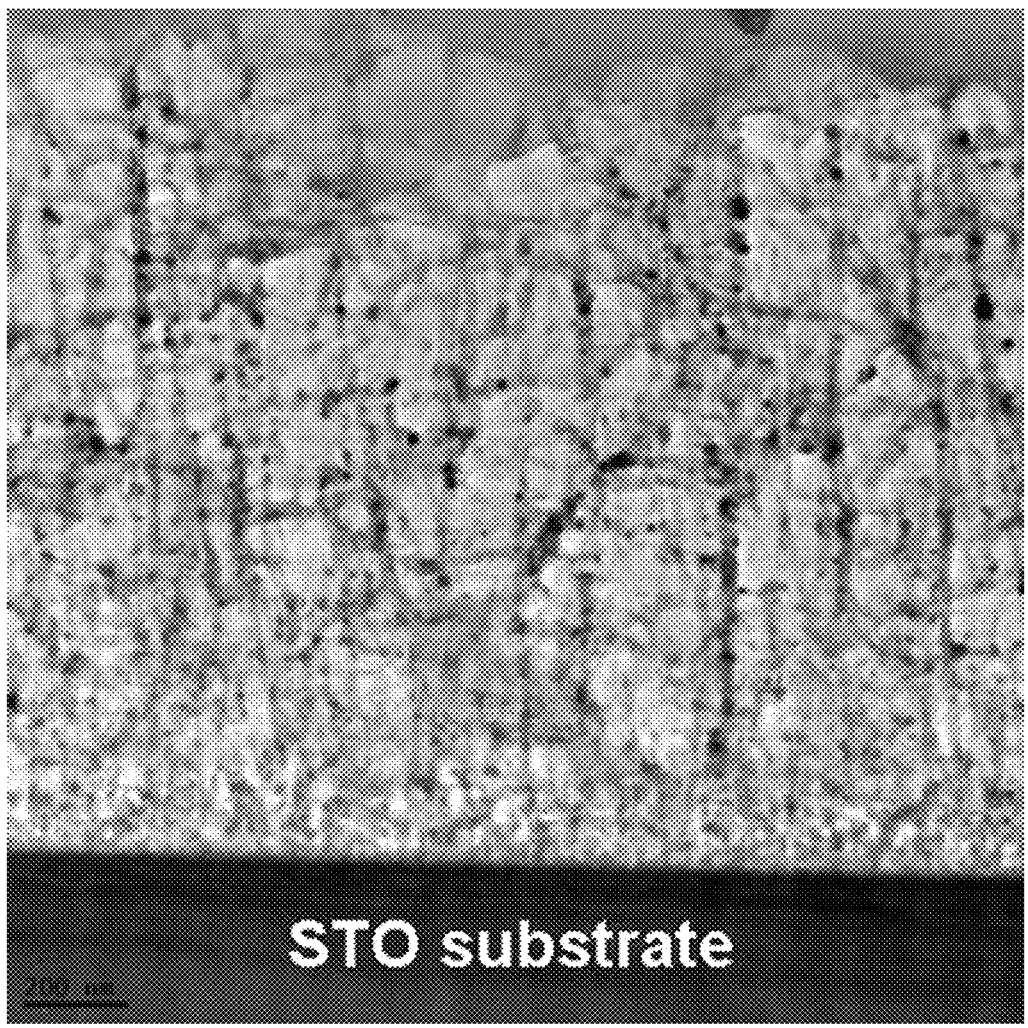
FIG. 3 is a cross-section TEM image of MgO nanobelts made in accordance with examples of the present invention, at a low magnification near the STO substrate showing that individual vertical nanobelts comprising the nanofence can be up to 1 μm long.
Figure 4:
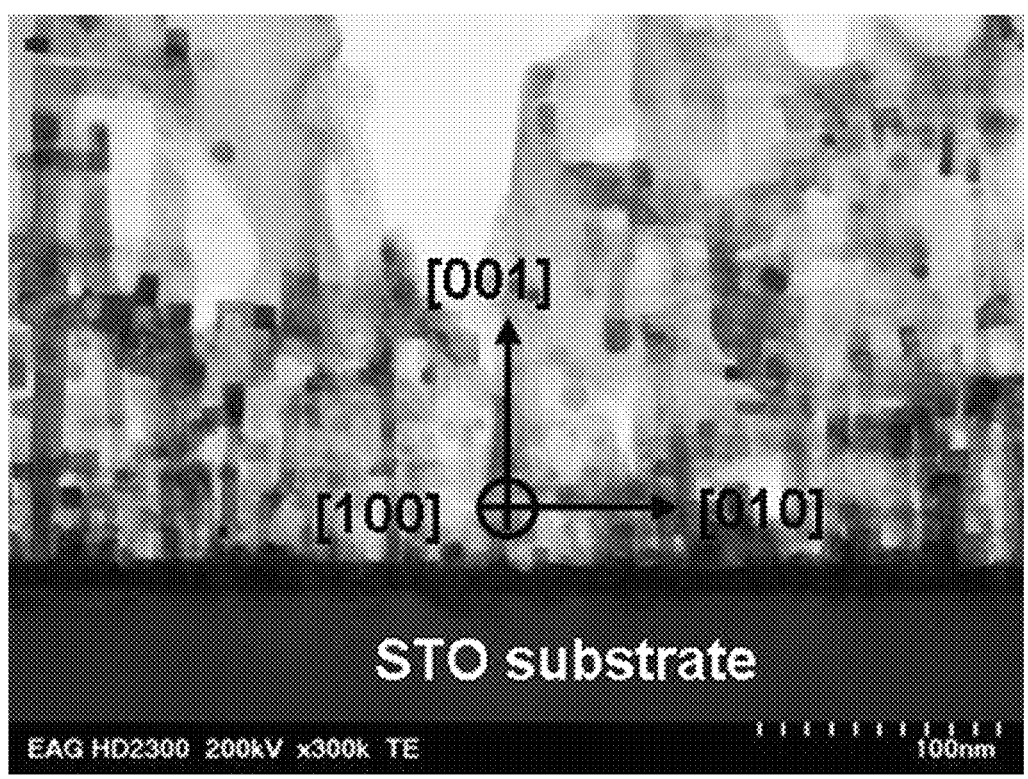
FIG. 4 is a cross-section TEM image of MgO nanobelts made in accordance with examples of the present invention, at intermediate magnification near the STO substrate clearly showing the <100> oriented MgO nanofence with respect to the STO substrate.
Figure 5:
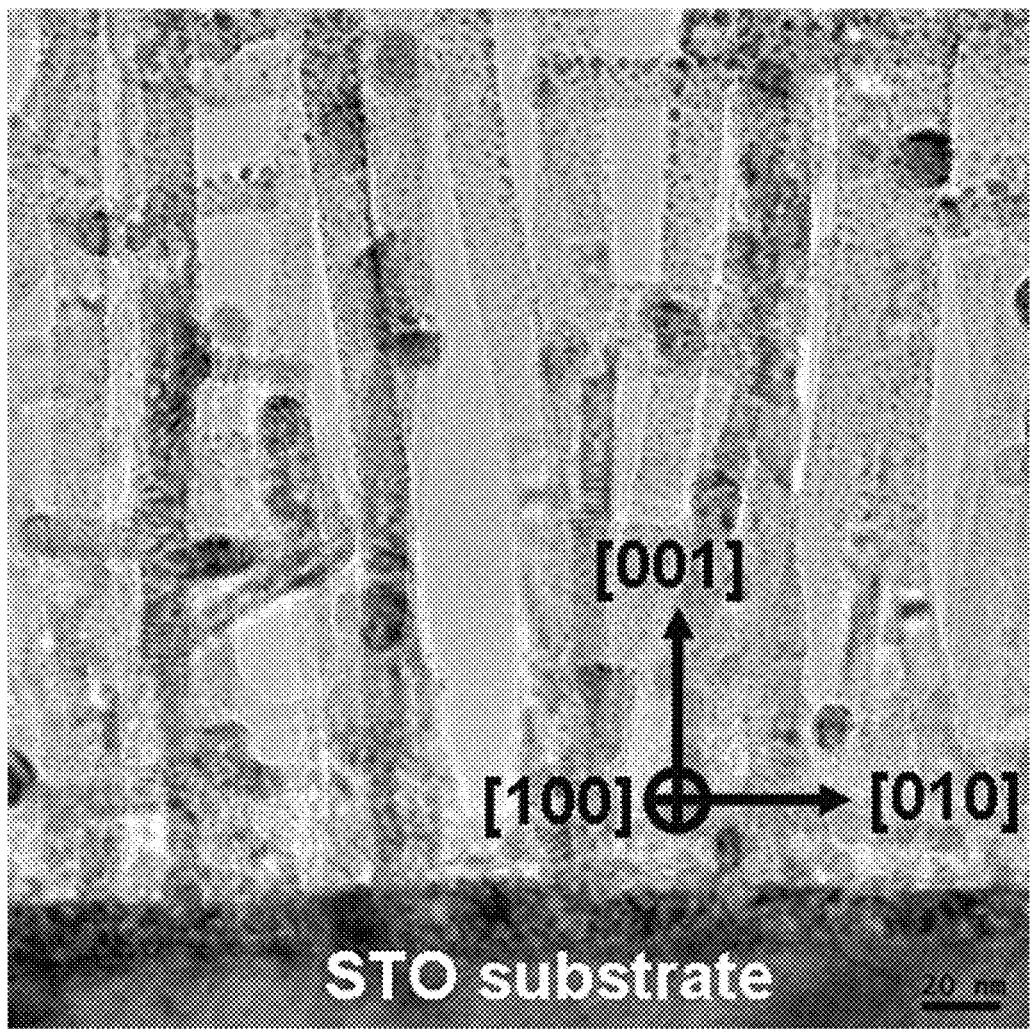
FIG. 5 is a cross-section TEM image of MgO nanobelts made in accordance with examples of the present invention, at high magnification near the STO substrate. The small dots on the surface of MgO nanobelts are platinum particles coming from TEM specimen preparation (a thin layer of Pt was sputtered on the surface before fabrication of sample via the focused-ion-beam (FIB) approach).

As shown in FIGS. 1, 2, FE-SEM images show semi-transparent MgO nanobelts that grow horizontally, parallel to the surface of STO substrate. The nanobelts are observed to have high aspect ratios with uniform diameters of 10-20 nm and lengths of 100-300 nm. It can be also seen that the nanobelts are not randomly distributed but aligned along [100] and [010] directions of the STO (100) substrate, as denoted by arrows in FIG. 2. Such a self-assembled pattern of MgO nanobelts resembles a 3D "fence". Since the SEM images were obtained from the top of the sample, nanobelts that grow perpendicular to STO substrate are not easily observed. Only Ni catalyst based nanospheres, imaged brightly in the SEM image, at tips of these vertical nanobelts of square cross-section are clearly visible. The vertically grown nanobelts were also examined using cross-sectional TEM microscopy as shown in FIGS. 3-5. The large, darkly-imaging spheres shown in the FIGS. 3-5 are the Ni catalyst. In FIG. 5, visible small dots on semi-transparent nanobelts were identified as platinum particles used for focused-ion-beam (FIB) preparation of TEM specimens.

Another TEM specimen with no platinum particles decoration was carefully prepared. TEM images of FIGS. 3, 4, and 6a-6c were obtained from the latter TEM specimen. FIG. 3 shows entire cross-section of the sample showing that vertical nanobelts have much higher aspect ratios with square cross-section, 10-20 nm on a side and with long lengths from 100 nm up to 1 μm, than those that grow horizontally. As shown in FIGS. 4, 5, another interesting feature is that all horizontally grown nanobelts oriented along the [φ] and [010] directions of STO are stemming from the nanobelts that grow vertically in general along STO [001] direction. One can also see that some of these ~90° branched nanobelts connect vertically grown nanobelts like a "sky bridge" between two tall buildings.

Figure 6A:
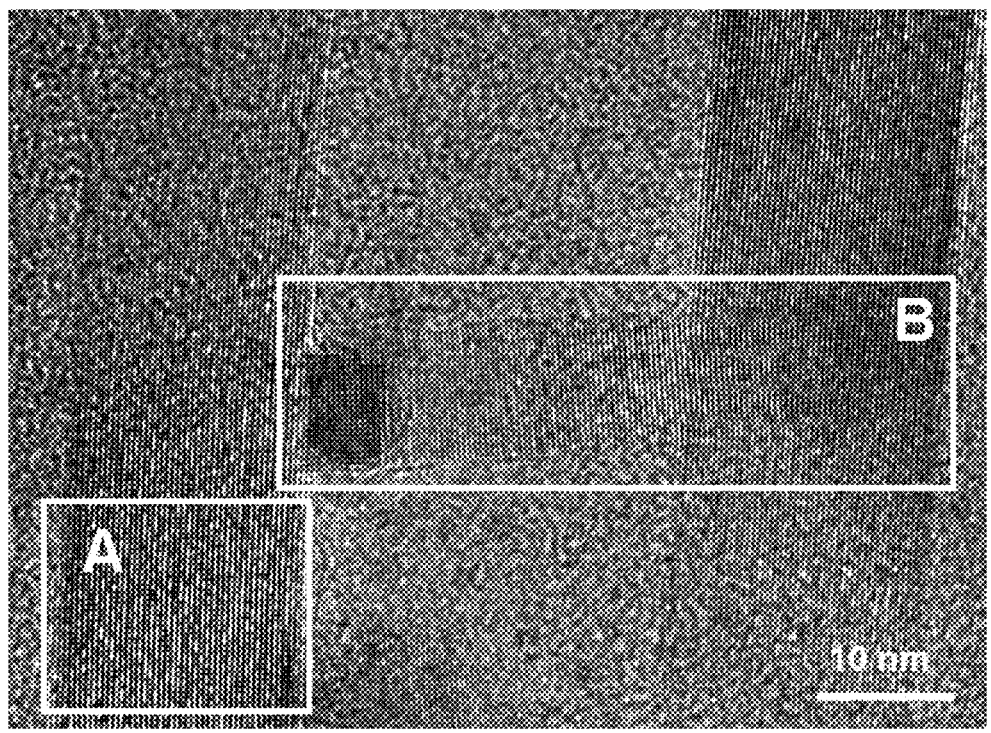
FIG. 6a is an intermediate magnification TEM image of MgO nanobelts in accordance with examples of the present invention, showing clear lattice fringes.
Figure 6B:
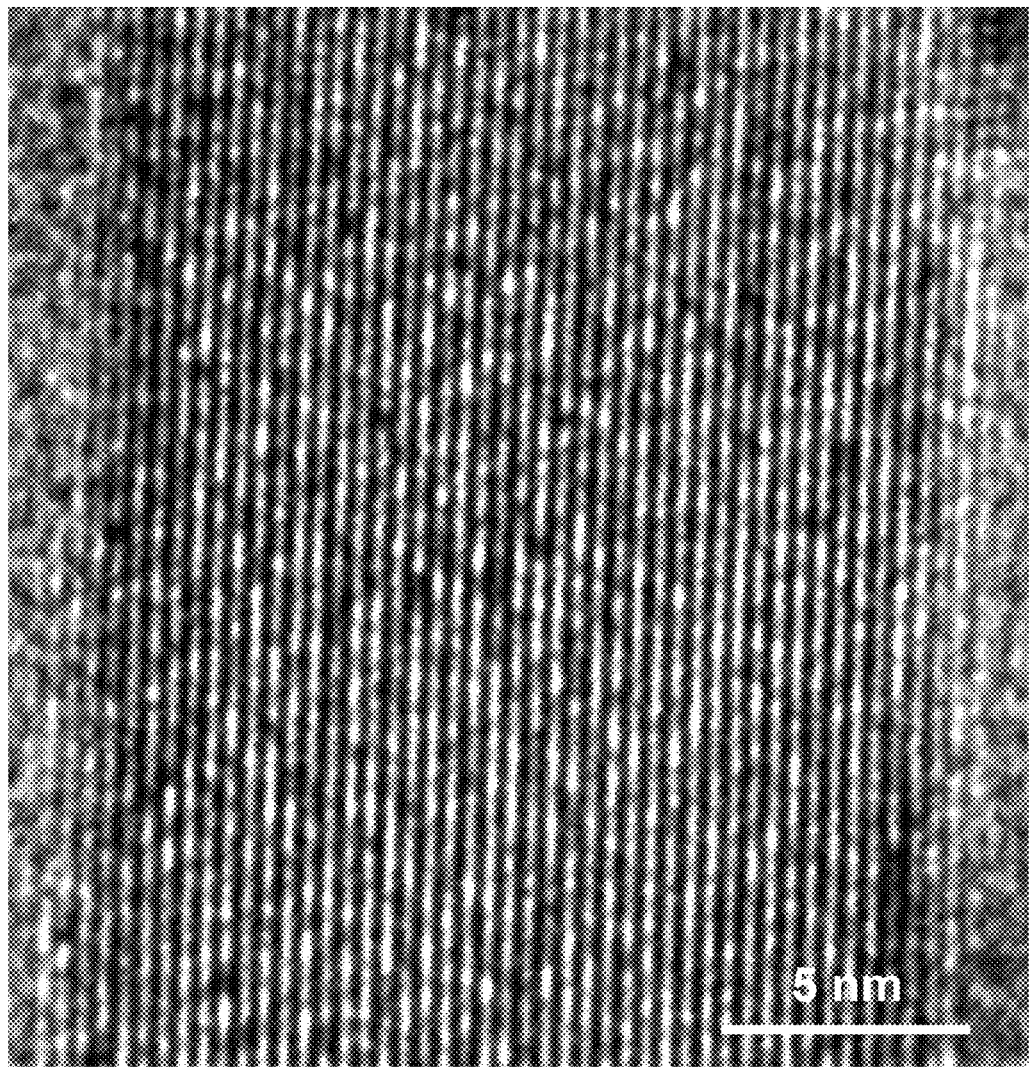
FIG. 6b is a higher magnification image of inset "A" of FIG. 6a showing that the lattice fringes continue to the edge of the nanobelt.
Figure 6C:
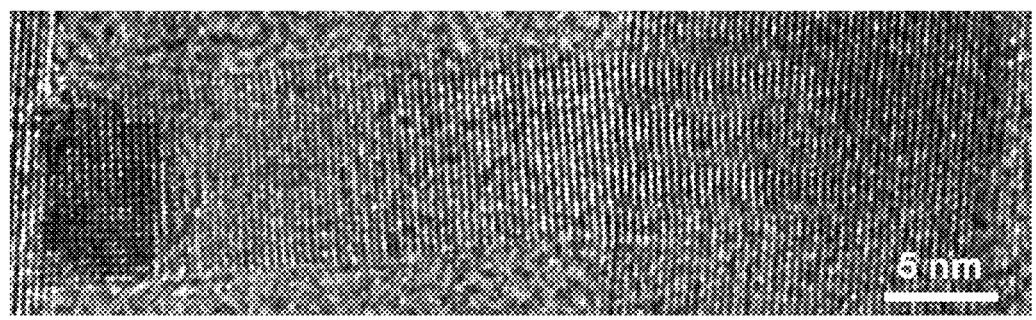
FIG. 6c is a higher magnification image of inset "B" of FIG. 6a showing that the lattice fringes continue to the edge of this horizontal nanobelt link.

Further TEM study was performed to examine individual MgO nanobelts more closely, as shown in FIGS. 6a-6c and 7a-7b. FIG. 6a shows a high-resolution TEM image showing lattice fringes in MgO nanobelts indicating their single crystalline nature as evidenced by the visible lattice fringes. FIG. 6b shows a higher magnification image of inset A in FIG. 6a. It can clearly be seen that the MgO lattice fringes extend all the way to the edges of the nanobelt. This single-crystal nature of individual segments comprising the nanofence is essential for subsequent growth of epitaxial, nanodevices. FIG. 6c shows a higher magnification image of horizontal link connecting the two vertical nanobelts shown in inset B of FIG. 6a. One can observe a slight tilt of the horizontal link from the <100> directions of STO. Such deviations result in the observed overall FWHM of omega and phi scans in the range of 4.4°-5.5°. One can further observe that the horizontal link, while tilted slightly from <100> directions, is also fully single crystalline. This is again clear from the lattice fringes of the link. Please note that at either ends, Moiré fringes due to two intersecting lattices from the vertical and horizontal nanobelts are observed.

Figures 7A, 7B:
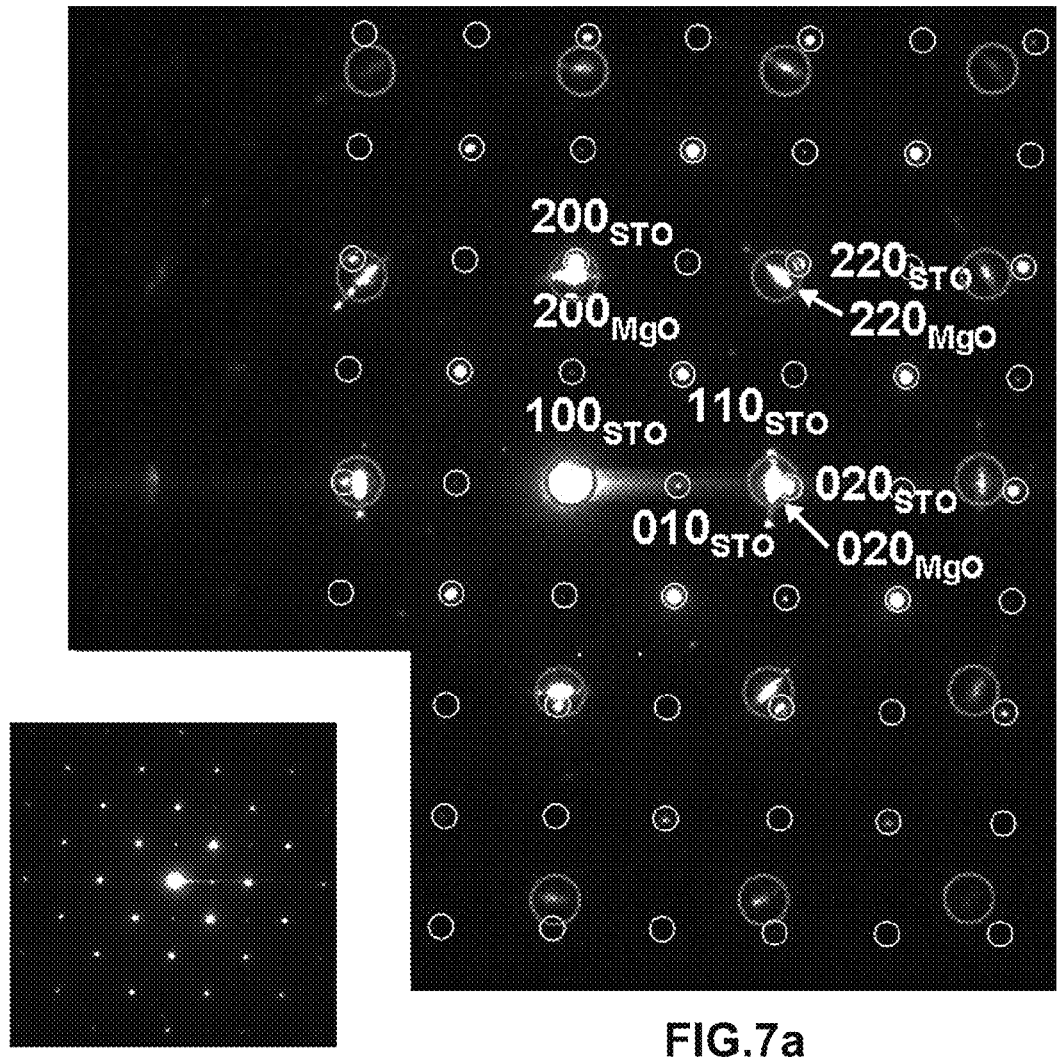
FIG. 7a is a SAD pattern obtained from a MgO nanofence made in accordance with examples of the present invention, and the STO substrate. Large and small circles indicate diffraction spots coming from the MgO nanobelts and STO substrate, respectively.
FIG. 7b is a SAD pattern for a STO substrate alone.

FIG. 7a shows a selected diffraction pattern (SAD) obtained from a region including the 3D MgO nanofence and the STO substrate. Diffraction spots for MgO single crystalline nanobelts (denoted by large circles) are slightly overlapped with but distinguishable from those for STO substrate (denoted by small circles) also shown in FIG. 7b, due to the difference in their lattice parameters (aMgO=4.21 Å and $a_{STO}$=3.905 Å). This result indicates epitaxial relationship between MgO nanobelts and STO substrate with $[100]_{MgO}||[100]_{STO}$. FIG. 7b is a SAD pattern for a STO substrate alone, for comparison.

Figure 8:
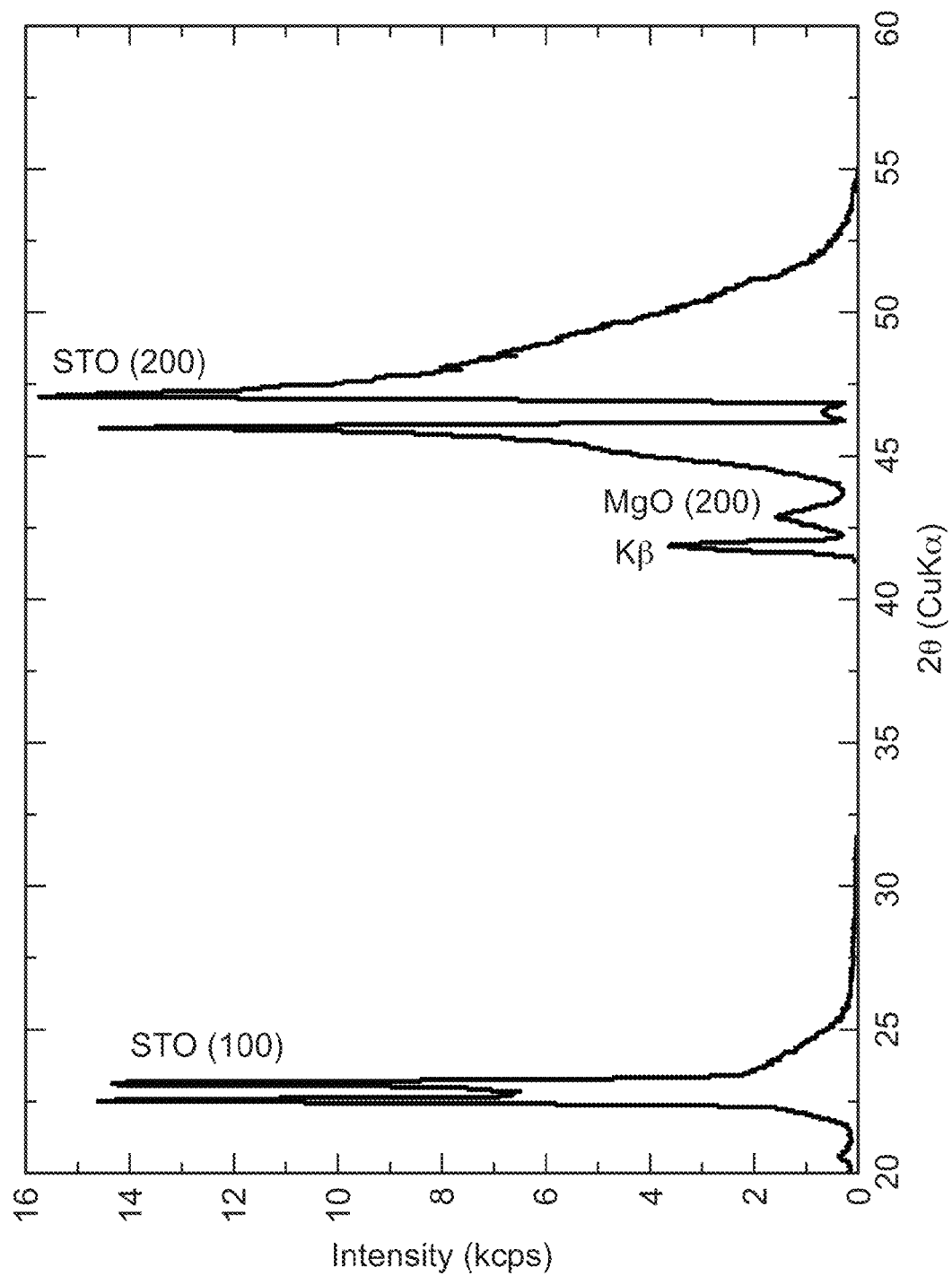
FIG. 8 is a graph showing XRD diffraction (200) ω-scan obtained from entire MgO "nanofence" layer., (b), and (c) in accordance with examples of the present invention.
Figure 9:
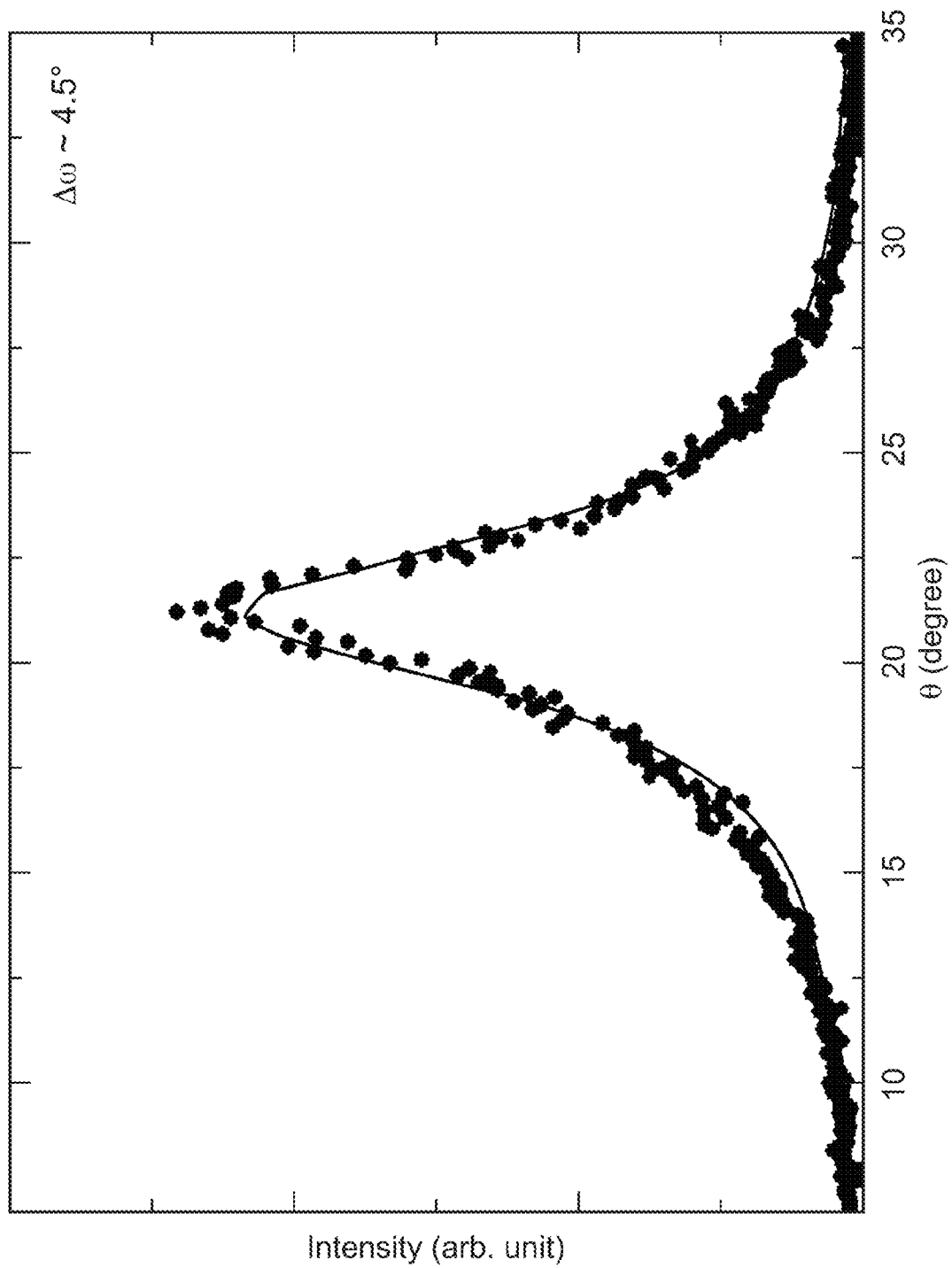
FIG. 9 is a graph showing XRD diffraction θ-2θ scan obtained from entire MgO "nanofence" layer in accordance with examples of the present invention.
Figure 10:
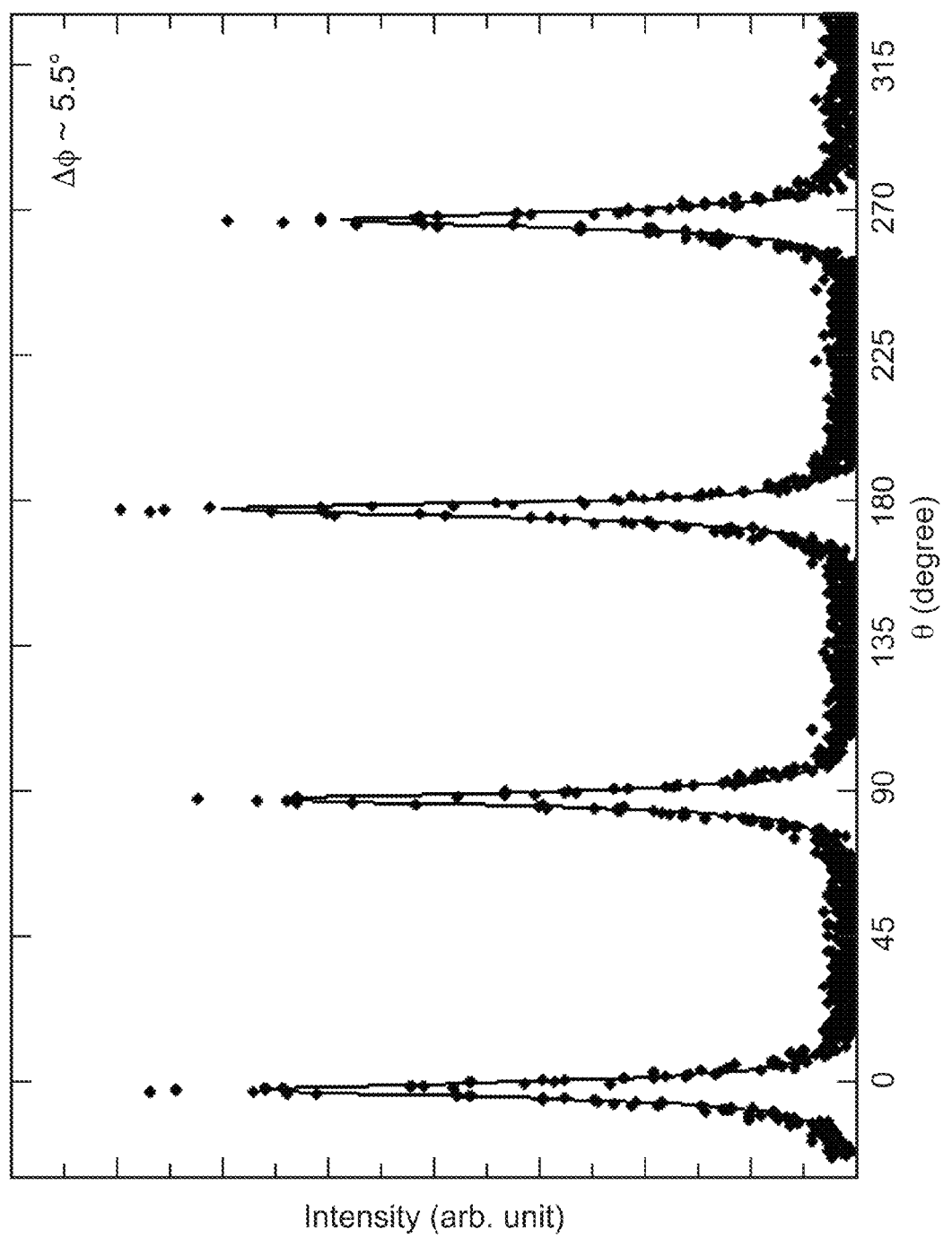
FIG. 10 is a graph showing XRD diffraction (220) φ-scan obtained from entire MgO "nanofence" layer in accordance with examples of the present invention.

FIGS. 8-10 show bulk X-ray diffraction (XRD) results obtained from entire 3D MgO nanofence layer. The θ-2θ scan in FIG. 8 shows only single MgO (200) peak with (h00) peaks of STO substrate. No peaks related to extra MgO crystallographic orientations are detected from a wide range of the scan. Referring to FIGS. 9, 10, in-plane and out-of-plane textures for the sample are also determined by (200) ω- and (220) φ-scans, respectively. Full-width-half-maximum, FWHM, of the (200) ω-scan and (220) φ-scan were measured to be ~4.5° and ~5.5°, respectively which are relatively broader than the values (Δω~1.0, Δφ~1.2) for reference sample, epitaxial MgO film grown on STO substrate. It is surprising that the XRD results for the sample are completely consistent with what one can observe from the SEM and TEM images shown in FIGS. 1-7b. If MgO nanobelts were randomly distributed, multiple orientations for MgO phase would be detected from θ-2θ scan for the sample, like previously reported results. The peak broadening of the MgO (200), 2θ peak (FIG. 8) is due to the nanoscale size of the MgO nanobelts. Large FWHM values in the ω- (FIG. 9) and φ-scans (FIG. 10) arise from the misalignments for MgO nanobelts which grow with vertical and horizontal directions, respectively with respect to STO substrate as shown in the SEM and TEM images of FIGS. 1-7a.

Figure 11:
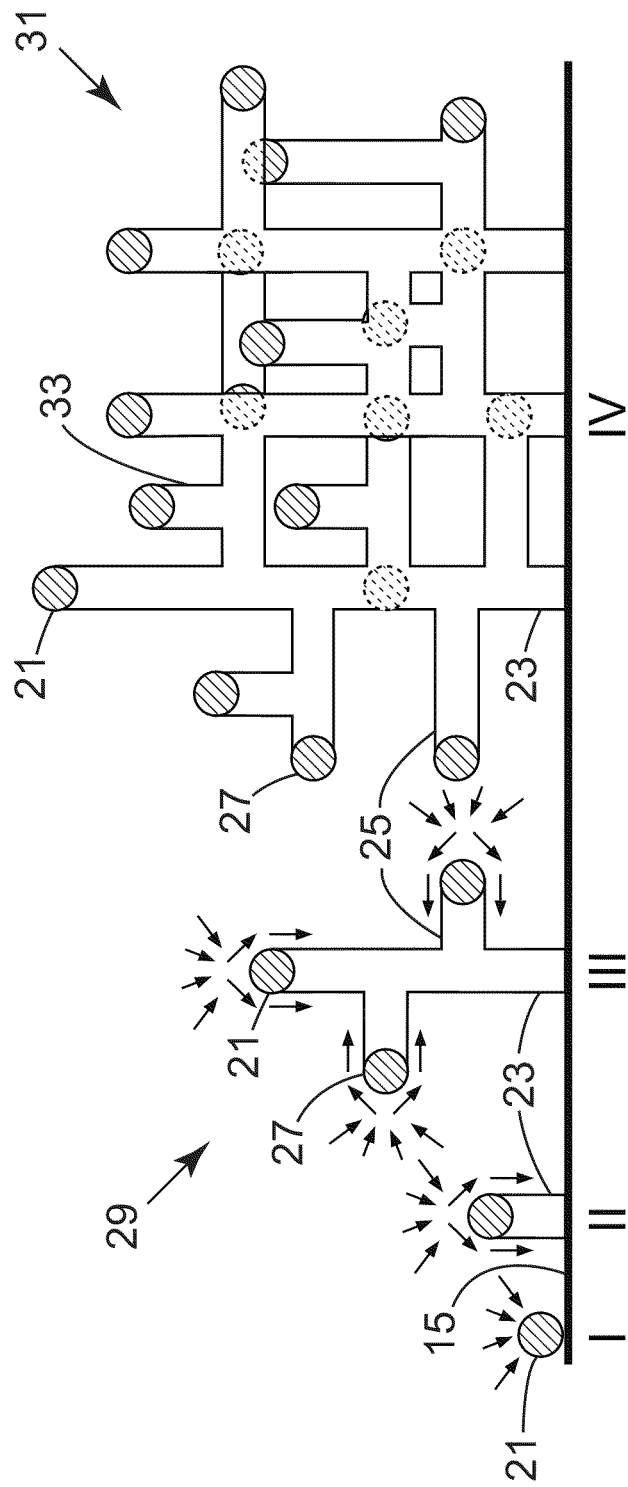
FIG. 11 is a schematic diagram illustrating growth and structure of a 3D MgO "nanofence" structure made via vapor-liquid-solid (VLS) mechanism in accordance with examples of the present invention.

FIG. 11 helps to further define, further describe, and explain the formation of a nanofence in accordance with the present invention. Region I shows, as arrows, the converging of Mg and Ni from vapors to form a liquid primary Mg+Ni droplet 21 on the substrate surface 15. Region II shows, via arrows, the formation of a MgO primary nanorod 23, which can grow in a direction predominantly perpendicular (vertical) to the substrate surface 15. Region III shows, via arrows, the formation of a branched nanorod structure 29 via 3D growth of MgO secondary nanorods 25 in radially outward directions from the primary nanorod 23, which can be predominantly parallel to the substrate surface 15, initiated by secondary Mg+Ni droplets 27 forming on the side surface of the primary nanorod 23. Region IV shows the 3D formation of an integral, 3D, grid-like nanofence 31 via further growth and interactions among primary nanorods 23, secondary nanorods 25, and branched nanorod structures 29. Tertiary nanorods 33 can form on the side surfaces of secondary nanorods 25, usually in directions predominantly perpendicular to the surface 15. Quaternary and so forth nanorods can form in likewise fashion. Nanorods can grow and connect at non-perpendicular angles, but the angles can be generally predominantly perpendicular, as illustrated in the TEM images described herein. Although FIG. 11 basically shows two dimensions, the skilled artisan will recognize that growth of the structure occurs in three dimensions. The nanofence 31 is a well developed, sturdy structure, well suited for various uses as described hereinbelow.

The modified VLS mechanism described hereinabove is believed to be responsible for the formation of the nanofence structure. As shown in the Figs., Ni based nanocluster spheres are clearly observed at the tips of nearly all of the nanobelts, which is a key evidence for the VLS mechanism. Note that these Ni based spheres can be easily removed if necessary, using proper etching agents such as $HCl:HNO_3=5:1$ and $HF:HNO_3=1:1$ (This may be required for subsequent growth of epitaxial nanoscale devices). In the schematic of the growth process resulting in the 3D nanofence structure, at the first stage (I), Mg and Ni vapors ablated from the target condense and form nanoscale Mg—Ni liquid droplets on the surface of the substrate. Although pure Ni has high melting point (m.p.=1450° C.), binary phase diagram of Mg—Ni shows that Mg-rich, Mg—Ni nanoclusters can exist as liquid phase at the growth temperature of ~780° C. Similarly, Au catalyst, one of widely used catalysts for growth of MgO nanowires, also has the m.p. of ~1080° C. but Mg—Au clusters can exist in liquid phase at much lower temperature than the m.p. of Au. In the second stage (II), excess Mg in the liquid droplets reacts with oxygen atoms or molecules, and forms solid MgO nanobelts that continue to grow vertically. Since a forming gas of 4% H2/Ar was used for the growth to avoid oxidation of Ni catalyst, very limited quantity of oxygen atoms or molecules was supplied from MgO target or residual oxygen molecules in chamber. Oxygen partial pressure level in the chamber is expected to be in the range of 10-16-10-24 atm, when deposition is performed at 200 mTorr of 4% $H_2$/Ar.

Figure 12:
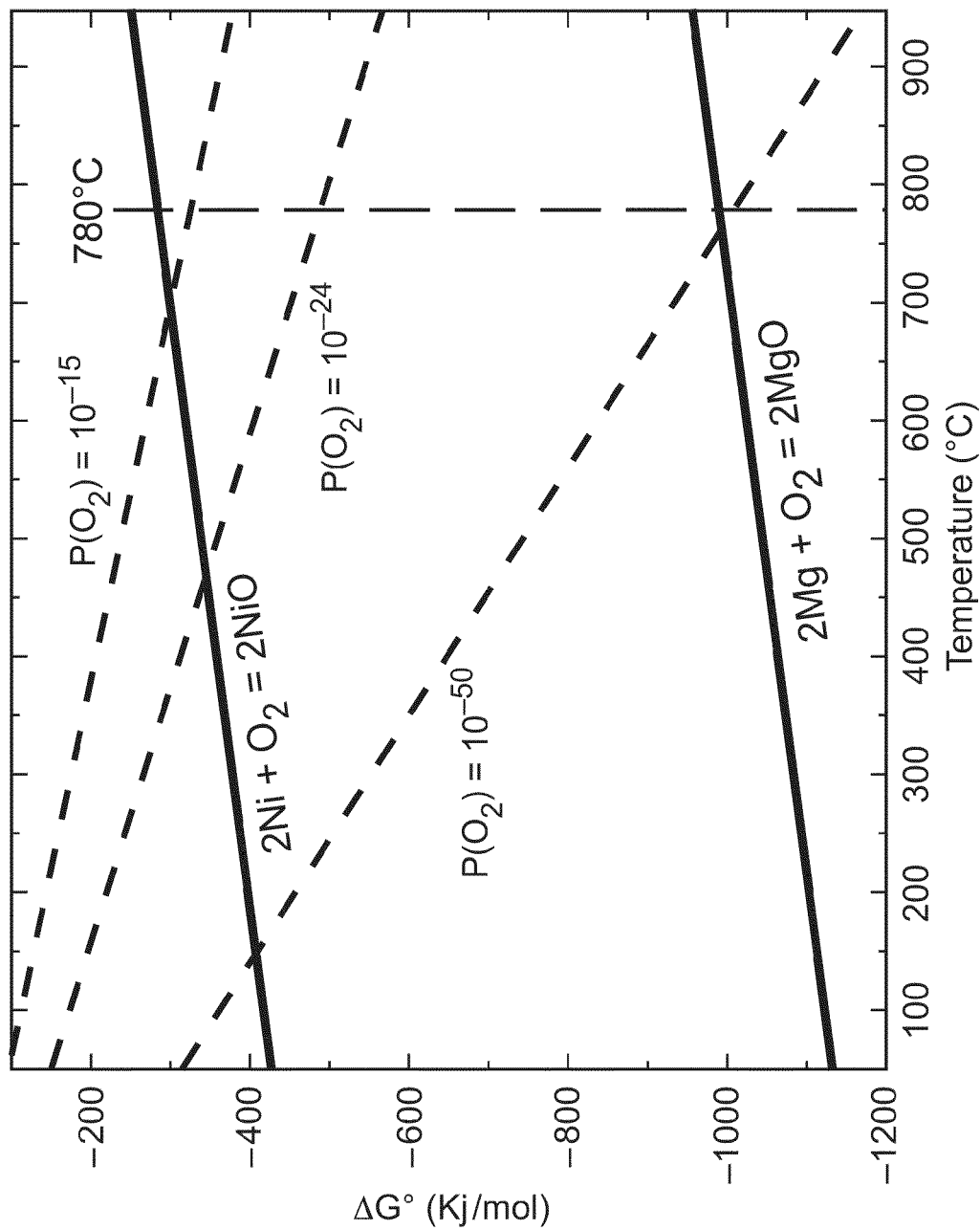
FIG. 12 shows an Ellingham diagram for Ni/NiO and Mg/MgO showing MgO and Ni with no oxidation are stable in the P(O2) range of 10-16-10-24 atm at the temperature of 780° C. in accordance with examples of the present invention.

FIG. 12 displays Ellingham diagram for Ni/NiO and Mg/MgO. At the growth temperature of 780° C., these oxygen pressure levels thermodynamically allow stable MgO and Ni without oxidation, indicating that this oxygen quantity should be enough to form MgO nanobelts assisted by Ni catalyst. It is also noted that no difference in structural and morphological features were also found between the samples with and without in-situ post-oxygen annealing at 500° C. for 30 min in $P(O_2)$=500 Torr after deposition, implying that sufficient oxygen was available during growth. It is important to note that square cross-section nanobelts are observed as opposed to round diameter "nanowires". This occurs due to the highly anisotropic surface energies of ceramics such as MgO. The {100} planes are the lowest surface energy planes and hence form the facets on these nanobelts. Since in cross-section of the vertical nanobelt, a similar growth rate is expected for the two different directions [100] or [010], a square cross-section results. Growth along the [100] direction is driven by the Ni catalyst. During the growth, in the third stage (III), Mg—Ni liquid droplets are also formed on the surface of vertically growing MgO nanobelts due to the continuous supply of Ni catalyst during growth. Hence MgO nanobelts nucleate and grow horizontally, parallel to the substrate as well. For one set of horizontally oriented nanobelts, the growth rate along the [010] and [001] is the same and the growth along [100] is driven by the Ni catalyst. For the other set of horizontally oriented nanobelts, the growth rate along the [100] and [001] is the same and the growth along [010] is driven by the Ni catalyst. Consequently, in the fourth stage (IV), the growth of single-crystal, MgO nanobelts, both vertically and horizontally and aligned along STO <100> directions results in a self-assembled, 3D nanofence structure shown in FIGS. 1-6c.

Figure 13:
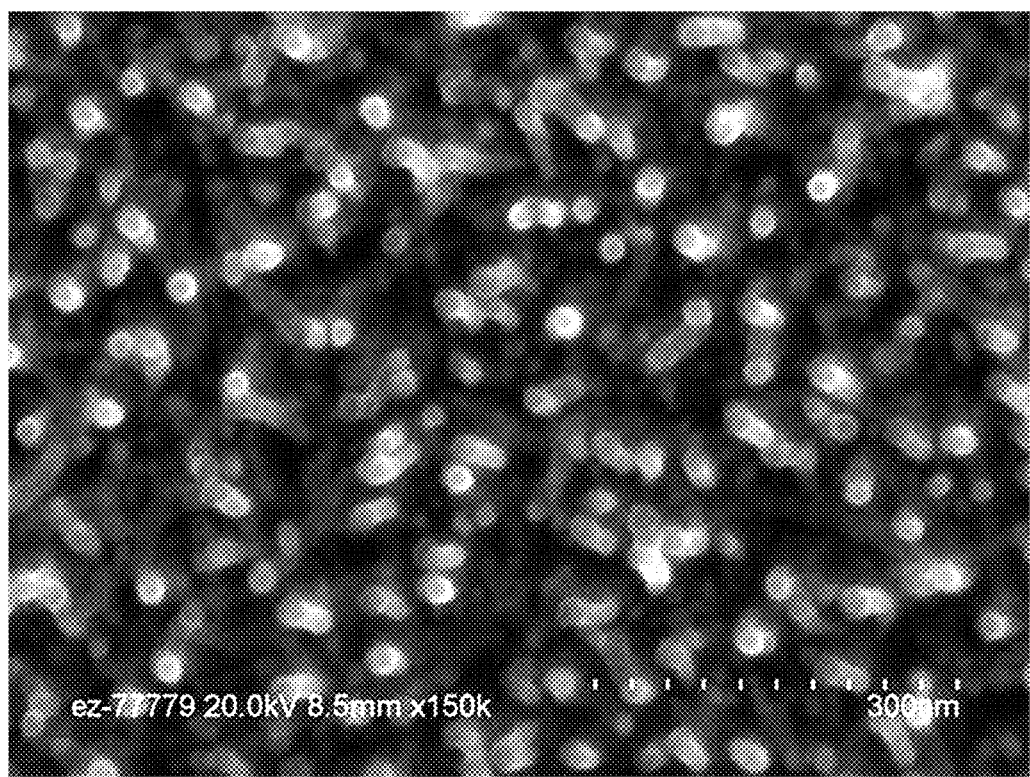
FIG. 13 is a plane view, 150 kx magnification SEM image of MgO nanobelts at a growth time of 5 min. in accordance with examples of the present invention.
Figure 14:
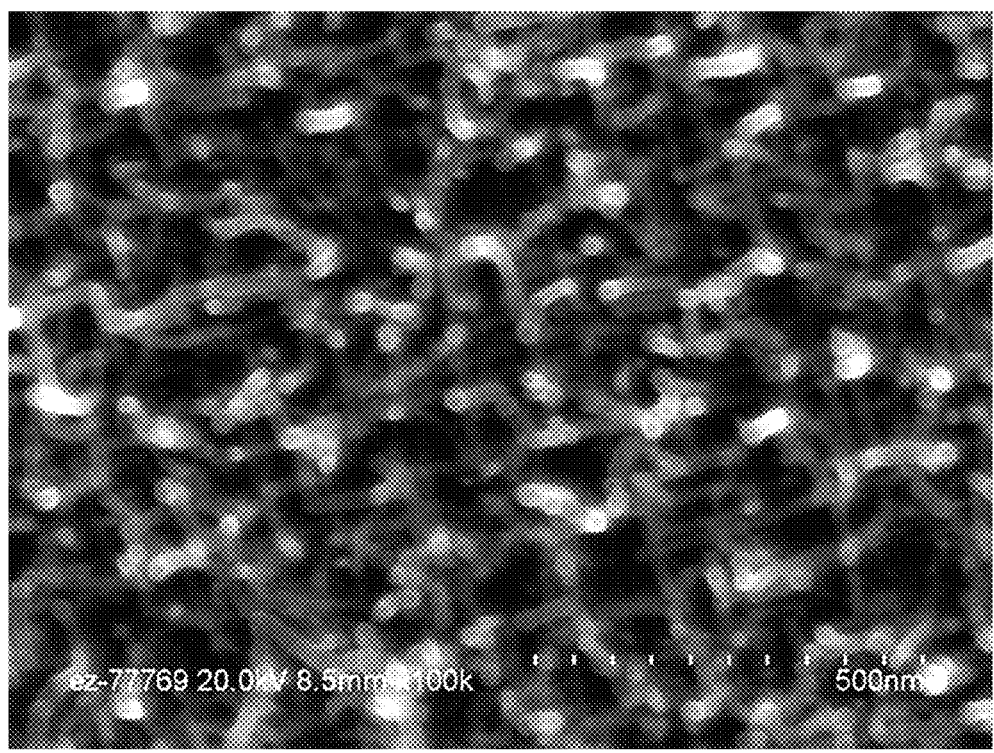
FIG. 14 is a plane view, 100 kx magnification SEM image of MgO nanobelts at a growth time of 10 min. in accordance with examples of the present invention.
Figure 15:
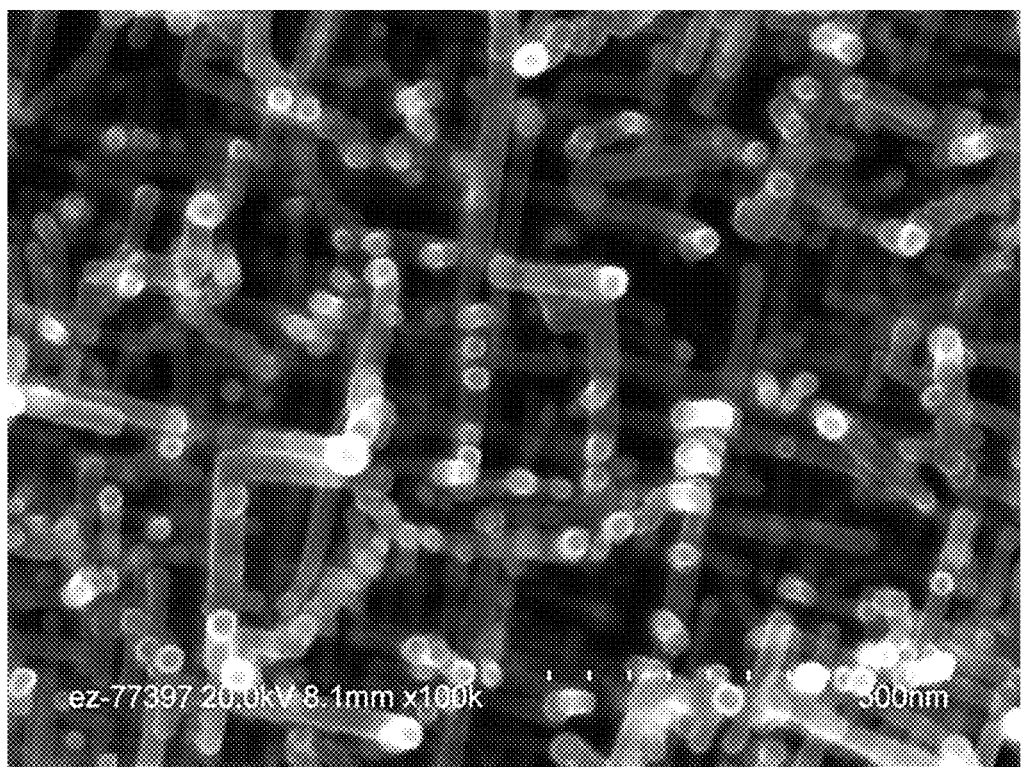
FIG. 15 is a plane view, 100 kx magnification SEM image of MgO nanobelts at a growth time of 30 min. in accordance with examples of the present invention.

The formation process of 3D MgO nanofence schematically illustrated in FIG. 11 was also confirmed by plane view SEM images taken from the samples grown for different growth times, as shown in FIGS. 13-15. MgO nanobelts indeed grow almost only in vertical direction when they start to grow, as shown in FIG. 13. After initial growth of MgO nanobelts vertically, the horizontal growth of 90° branched, MgO nanobelts occurs on the surface of vertically grown MgO nanobelts by continuous supply of the Ni catalyst as shown in FIG. 14. Finally, the 3D nanofence comprised of self assembled, single crystalline, MgO nanobelt segments is formed as shown in FIG. 15. Similar 3D nanofences using the method described in this letter should be possible for a range of materials by an appropriate selection of the catalyst material. Lastly, since the 3D nanofence is completely heteroepitaxial, such structures can be produced reproducibly and on large area substrates. Any device stack that can be grown epitaxially on a flat, macroscopic, single-crystal MgO substrate can now be grown on the 3D nanotemplated substrate.

Nanofences can be grown using a variety of deposition methods including physical vapor deposition techniques such as pulsed laser ablation, sputtering, e-beam deposition, pulsed electron deposition, chemical vapor deposition techniques including metal-organic chemical vapor deposition, and the like. Growth can be done using a single source or multiple sources. Both the metal catalyst and the source materials can be supplied continuously in a deposition system or in tube furnace via gas flow wherein gases transport the source materials to a substrate kept at a predetermined temperature. In order to obtain greater control in the morphology of the nanofence, the supply of the metal catalyst may be sequential or intermittent as opposed to continuous.

Figure 16:
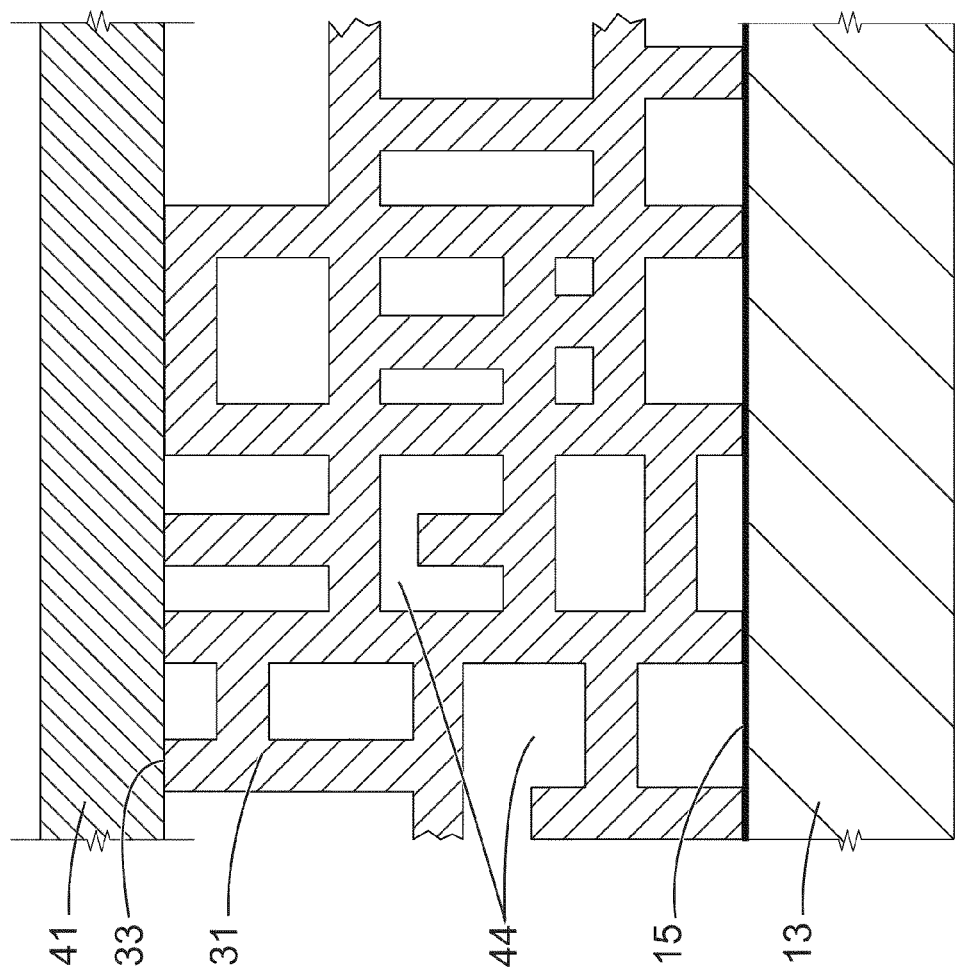
FIG. 16 is a schematic, not-to-scale diagram illustrating a nanofence overlaid by another layer.

Once the 3D nanofence is formed on the substrate surface, at least one additional layer and/or multilayers of various functional materials, generally different materials from that of the nanofence material, can be deposited on, around, and/or throughout the nanofence using like methods as above and/or other methods, including chemical solution deposition methods such as sol-gel deposition or metal-organic deposition. As shown in FIG. 16, an additional overlayer 41 can, for example, simply overcoat the nanofence 31 by overlaying the top surface 33 thereof, being supported thereby. The overlayer 41 does not have significant contact with the substrate 13, particularly the substrate surface 15, nor does the overlayer 41 significantly penetrate the nanofence interstices 44. The overlayer 41 can be nonporous as shown, or porous (not shown).

Figure 17:
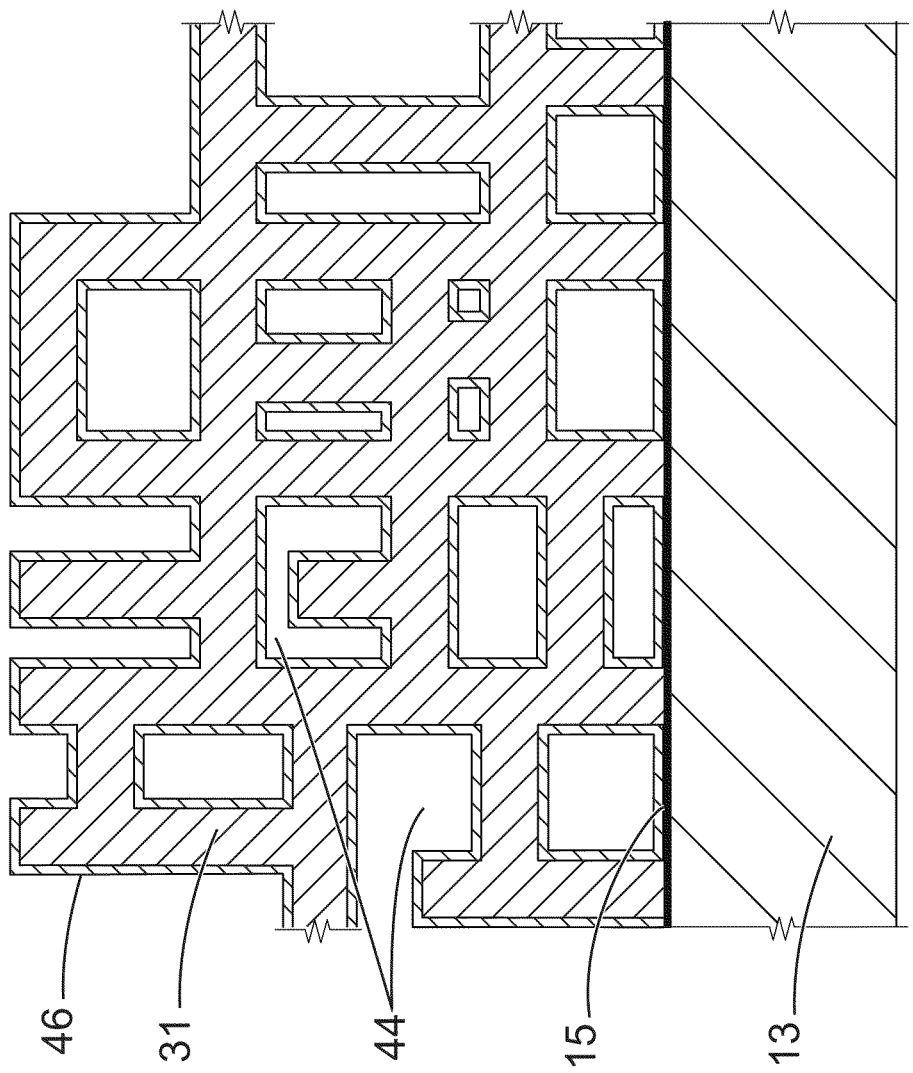
FIG. 17 is a schematic, not-to-scale diagram illustrating a nanofence enveloped by another layer.

Moreover, an additional layer can envelop the nanofence by infiltrating the nanofence and coating (enveloping) the individual nanorods that comprise the nanofence while only partially filling the porosity of the nanofence. Hence, as shown in FIG. 17 the nanofence 31 is enveloped by and supports an enveloping layer 46, which penetrates the nanofence interstices 44 and can coat the substrate surface 15 as well. However, the enveloping layer 46 does not significantly fill the nanofence interstices 44; the resulting article is essentially porous.

Figure 18:
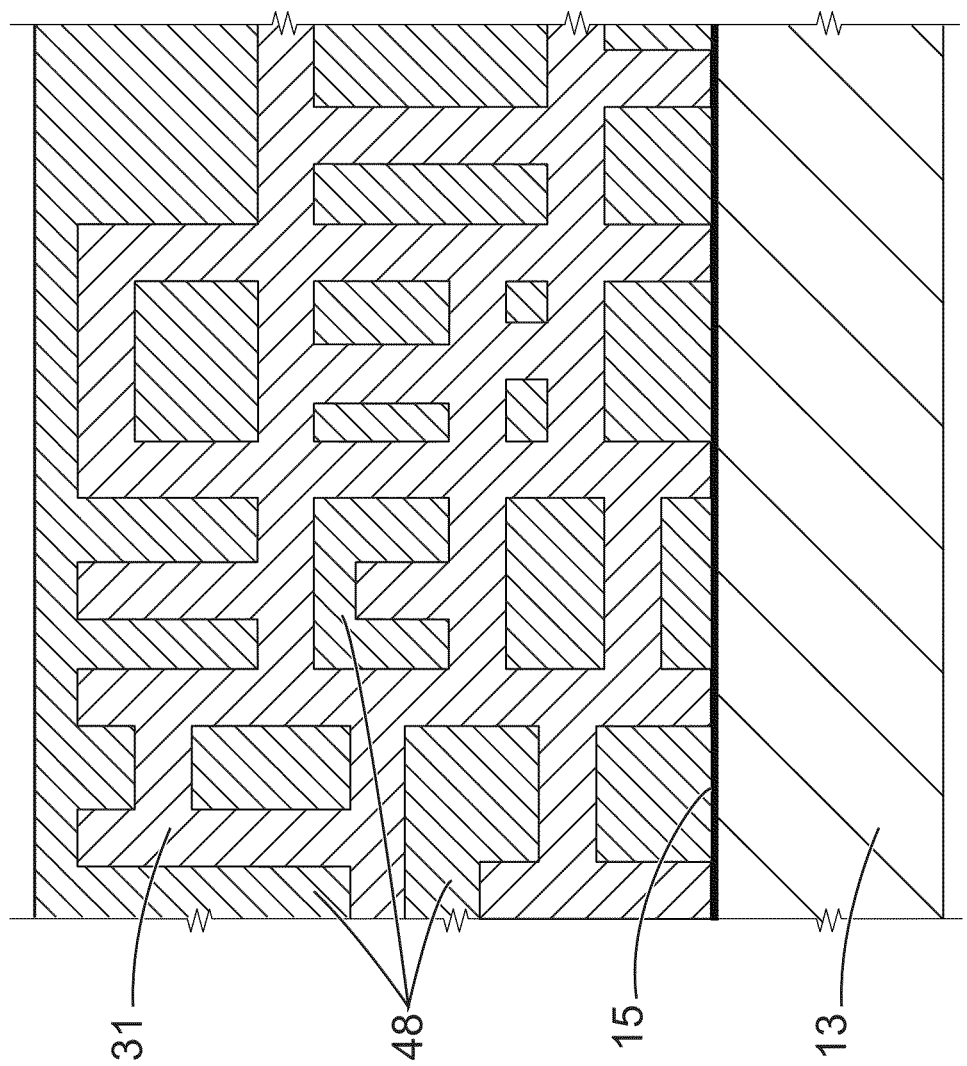
FIG. 18 is a schematic, not-to-scale diagram illustrating a nanofence embedded within another layer.

Moreover, an additional layer can completely (or nearly completely) infiltrate the nanofence and essentially fills (or nearly fills) the porosity thereof to form a nanofence composite wherein the nanofence is at least partially embedded in the additional layer. The resulting article can be called a "composite" material; the additional layer can be called a "matrix" layer or "matrix" phase, and the nanofence can be called an "embedded" layer or "embedded" phase. FIG. 18 shows a nanofence 31 that is embedded in the matrix material 48, which can coat the substrate surface 15 as well. Some incidental porosity (not shown) may remain, but the resulting article is essentially nonporous.

For example, once a substrate surface with an epitaxial nanofence is provided, a superconductor such as, for example rare-earth barium-copper-oxide (REBCO), can be grown around (envelop) the nanofence in two broadly defined ways:

1) In-situ deposition: In this case, the superconductor film is deposited epitaxially on the biaxially textured surface over, around, and throughout the nanofence using an in-situ deposition technique such as laser ablation, sputtering, e-beam co-evaporation, chemical vapor deposition, metal-organic chemical vapor deposition, chemical solution deposition, liquid phase epitaxy, hybrid liquid phase epitaxy, and the like. The result is a superconductor layer on the substrate surface, in which the nanofence is embedded.

2) Ex-situ deposition: In this case, first a superconductor precursor film is first deposited on the substrate surface over, around, and throughout the nanofence. This is followed by a heat-treatment or an annealing step at a temperature greater than 500° C. to form the superconductor layer within which the nanofence is embedded. Examples of conventional techniques suitable for this step include chemical solution deposition methods such as using the MOD method, particularly with fluorine-containing precursors or e-beam or thermal co-evaporation with fluorine-containing precursors.

A 3D "nanofence" template as described herein can also enable topographically enhanced light trapping photovoltaic cells which produce a photocurrent per $cm^2$ of footprint significantly higher than that of commercially available, planar, single-crystal, inorganic devices. The use of core-shell and multi junction cells allow for higher carrier collection efficiencies and higher overall efficiencies respectively. Such a 3D nanofence structure can also be used as a template for both the anode and cathode electrode for Li-ion batteries. Growth of Si and Li-oxides on such a structure can enable an ideally nanostructured anode and cathode respectively for high storage capacity Li-ion batteries.

The basic rationale of using such a nanotemplate for improving the properties of both solar cells and batteries is explained hereinbelow.

Radial p-n single junction and radial p-n multiple junction nanowire solar cells are considered to be very attractive for realizing high-efficiency solar cells, particularly those that function as Gratzel cells. In such core-shell, nanowire solar cells, photo-excited electrons and holes travel very short distances before being collected by electrodes. This results in high carrier-collection efficiency and allows significantly higher tolerance for material defects and use of lower-quality semiconductor materials. In addition, the nanowire array geometry allows for multiple impingements and scattering of the incident photon thereby significantly increasing the probability of absorption due to extended dwell time in the photoactive layers resulting in enhanced "light trapping". In some cases, it will be advantageous to have the nanofence made of an electrically conducting material to realize superior collection efficiencies.

In some examples of the present invention, a radial p-n junction comprising single or multiple junction solar cells is deposited on and envelops a conductive nanofence to form a unique solar cell configuration. The conductive nanofence acts as the electrode.

Silicon is a very attractive anode material for lithium-ion batteries because it has a low discharge potential and the highest known theoretical charge capacity (4,200 mAh/g), ten times higher than existing graphite anodes and much larger than most nitride and oxide materials. Recently, it has been demonstrated that core-shell Si nanowires with amorphous Si exterior embedded within the Li-ion battery have high charge storage capacity (~1000 mAh/g, 3 times of carbon) with ~90% capacity retention over 100 cycles. Excellent electrochemical performance at high rate charging and discharging (6.8 A/g, ~20 times of carbon at 1 h rate) was also demonstrated. Also, for cathode materials for Li-ion batteries, nanostructured Li-oxides such as $Li_xCoO_2$ and $LiMnO_2$ have been shown to exhibit high performance due to surface-to-volume ratio that allows for a large electrode-electrolyte contact area.

As described herein, solar cells and Li-ion battery electrodes can be effectively addressed by growth of relevant films on the 3D nanofence template, either as an enveloping layer or as a matrix layer. Growth of a core-shell p-n junction as well as multijunction cells on such a nanostructured template can result in much higher overall efficiency solar cells than have been realized so far using aligned nanorods. Similarly, growth of a crystalline or amorphous Si layer or a suitable Li-oxide material on such a 3D nanostructured template will provide for an ideal high-performance anode and cathode material respectively.

While there has been shown and described what are at present considered to be examples of the invention, it will be obvious to those skilled in the art that various changes and modifications can be prepared therein without departing from the scope of the inventions defined by the appended claims.

What is claimed is:

1. An article comprising a substrate having a surface, and a biaxially-textured nanofence supported by said surface, said nanofence comprising a multiplicity of primary nanorods and branch nanorods, each of said primary nanorods being attached to said substrate, each of said branch nanorods being attached to at least one other of said primary nanorods and said branch nanorods, said primary nanorods and said branch nanorods being arranged in a three-dimensional, interconnected, interpenetrating, grid-like network defining interstices within said nanofence, said article further comprising an enveloping layer supported by said nanofence, said enveloping layer disposed in said interstices and forming a coating on said primary nanorods and said branch nanorods, said enveloping layer having a different composition from that of said nanofence, said enveloping layer comprising at least one photovoltaic material selected from the group consisting of a radial p-n single junction solar cell material and a radial p-n multiple junction solar cell material.

2. An article in accordance with claim 1 wherein said primary nanorods and said branch nanorods interconnect at predominantly perpendicular intersections.

3. An article in accordance with claim 1 wherein said substrate is selected from the group consisting of a single-crystal substrate, a biaxially textured substrate, and an untextured body having adhered thereon a crystallographic surface layer.

4. An article in accordance with claim 1 wherein said nanofence is characterized by a crystal structure selected from the group consisting of rock-salt, fluorite, pyrochlore, and perovskite.

5. An article in accordance with claim 1 wherein said nanofence comprises at least one composition selected from the group consisting of an oxide, a nitride, a carbide, and a boride.

6. An article in accordance with claim 5 wherein said oxide comprises at least one oxide selected from the group consisting of MgO, ZnO, $ZrO_2$, $Nb_2O_3$, $Ta_2O_3$, $SnO_2$, $TiO_2$, $BaMO_3$, and $SrMO_3$, where M comprises at least one cation selected from the group consisting of Zr, Ti, and Sn.

7. An article in accordance with claim 1 wherein each of said primary nanorods and each of said branch nanorods comprises a single crystal nanostructure.

8. An article in accordance with claim 1 further comprising an overlayer supported by a surface of said nanofence, said overlayer not significantly penetrating said interstices, said overlayer having a different composition from that of said nanofence.

9. An article in accordance with claim 1 wherein said nanofence comprises an oxide of Li.

10. An article in accordance with claim 9 wherein said nanofence further comprises at least one additional element selected from the group consisting of Co and Mn.

11. An article in accordance with claim 1 wherein said enveloping layer comprises an oxide of Li.

12. An article in accordance with claim 11 wherein said enveloping layer further comprises at least one additional element selected from the group consisting of Co and Mn.

13. An article comprising a substrate having a surface, and a biaxially-textured nanofence supported by said surface, said nanofence comprising a multiplicity of primary nanorods and branch nanorods, each of said primary nanorods being attached to said substrate, each of said branch nanorods being attached to at least one other of said primary nanorods and said branch nanorods, said primary nanorods and said branch nanorods being arranged in a three-dimensional, interconnected, interpenetrating, grid-like network defining interstices within said nanofence, said article further comprising a matrix layer in contact with said nanofence, said matrix layer disposed within interstices of said nanofence so that said nanofence is at least partially embedded within said matrix layer, said matrix layer having a different composition from that of said nanofence said matrix layer comprising a rare-earth barium-copper-oxide superconducting material.

14. An article in accordance with claim 13 wherein said nanofence comprises an oxide of Li.

15. An article in accordance with claim 14 wherein said nanofence further comprises at least one additional element selected from the group consisting of Co and Mn.

16. An article in accordance with claim 13 wherein said matrix layer comprises an oxide of Li.

17. An article in accordance with claim 16 wherein said matrix layer further comprises at least one additional element selected from the group consisting of Co and Mn.

* * * * *